(12) United States Patent
Choi

(10) Patent No.: US 8,323,997 B2
(45) Date of Patent: Dec. 4, 2012

(54) METHOD OF MANUFACTURING COLOR PRINTED CIRCUIT BOARD

(75) Inventor: Kwan Soo Choi, Gyeonggi-do (KR)

(73) Assignee: Digital Graphics Incorporation, Gyeonggi-Do (KR)

(*) Notice: Subject to any disclaimer, the term of this patent is extended or adjusted under 35 U.S.C. 154(b) by 384 days.

(21) Appl. No.: 12/789,128

(22) Filed: May 27, 2010

(65) Prior Publication Data

US 2011/0003411 A1    Jan. 6, 2011

(30) Foreign Application Priority Data

Jul. 6, 2009    (KR) .................. 10-2009-0061237

(51) Int. Cl.
*H01L 33/50* (2010.01)
*H01L 33/62* (2010.01)

(52) U.S. Cl. ............... 438/26; 438/35; 257/E33.057; 257/33.06

(58) Field of Classification Search ........... 257/E33.057, 257/E33.06; 438/26, 28, 35
See application file for complete search history.

(56) References Cited

U.S. PATENT DOCUMENTS

| | | | |
|---|---|---|---|
| 4,770,498 A * | 9/1988 | Aoki et al. ................ | 349/47 |
| 7,303,315 B2 * | 12/2007 | Ouderkirk et al. ........ | 362/294 |
| 7,626,208 B2 * | 12/2009 | Yang et al. ................ | 257/88 |
| 7,740,376 B2 * | 6/2010 | Wuu et al. ................ | 362/249.04 |
| 8,148,727 B2 * | 4/2012 | Kang et al. ............... | 257/59 |
| 2002/0081503 A1 * | 6/2002 | Kawase et al. ........... | 430/7 |
| 2005/0003283 A1 * | 1/2005 | Kawase et al. ........... | 430/7 |
| 2005/0116235 A1 * | 6/2005 | Schultz et al. ............ | 257/79 |
| 2005/0247944 A1 * | 11/2005 | Haque et al. ............. | 257/79 |
| 2006/0227523 A1 * | 10/2006 | Pennaz et al. ............ | 361/783 |
| 2008/0011225 A1 * | 1/2008 | McClure et al. .......... | 118/244 |
| 2008/0188020 A1 * | 8/2008 | Wei-Min et al. .......... | 438/27 |
| 2009/0311810 A1 * | 12/2009 | Yang et al. ................ | 438/28 |
| 2010/0060822 A1 * | 3/2010 | Sun .......................... | 349/71 |
| 2011/0042699 A1 * | 2/2011 | Park et al. ................ | 257/98 |
| 2011/0260179 A1 * | 10/2011 | Hung ........................ | 257/88 |

FOREIGN PATENT DOCUMENTS

JP    09226118 A  *  9/1997

* cited by examiner

*Primary Examiner* — George Fourson, III
(74) *Attorney, Agent, or Firm* — Saliwanchik, Lloyd & Eisenschenk

(57) ABSTRACT

Disclosed herein is a method of manufacturing a color printed circuit board. The method includes non-consecutively printing a conductive ink on a flexible insulation board in a piezoelectric inkjet manner to form an electrically conductive pattern, applying an electrically conductive bonding agent to a light emitting chip mounting portion of the electrically conductive pattern for mounting a light emitting chip, forming a waterproof layer on an overall surface of a resultant after mounting the light emitting chip on the light emitting chip mounting portion of the electrically conductive pattern to which the electrically conductive bonding agent is applied, and forming a color pattern on an overall surface of the light emitting diode using a color ink.

5 Claims, 3 Drawing Sheets

METHOD OF MANUFACTURING COLOR PRINTED CIRCUIT BOARD

CROSS-REFERENCE TO RELATED APPLICATION

This application claims the benefit under 35 U.S.C. §119 (a) of Korean Patent Application No. 10-2009-0061237, filed on Jul. 6, 2009, which is hereby incorporated by reference in its entirety.

FIELD OF THE INVENTION

The present invention relates to a method of manufacturing a color printed circuit board and, more particularly, to a method of manufacturing a color printed circuit board, which includes printing an electrically conductive pattern on a flexible board with a conductive ink and printing a color pattern on a light emitting chip mounted on the board using a color ink to exhibit a color, thereby enabling reduction in time and cost for manufacturing the color printed circuit board.

DESCRIPTION OF THE RELATED ART

Traffic signboards, information panels, advertisement boards, or the like are printed or painted with desired information to be imparted to road users, and provided with lighting to illuminate the printed or painted information for clearer recognition at night.

As the lighting, an electric bulb such as a fluorescent lamp is disposed inside a sign panel, such as an advertisement board or the like, such that light emitted from the bulb passes through a cloth or a thin board (acrylic panel or the like) in front of the bulb. Alternatively, a lamp is disposed outside the sign panel to allow light from the lamp to be directed towards the sign panel, so that content printed on the sign board can be recognized.

Such conventional lighting has many drawbacks. For example, when an electric bulb such as a fluorescent lamp is disposed inside the sign panel, the sign panel significantly increases in size and thickness, thereby making it difficult to manufacture and put the sign panel in place. Moreover, in this case, since the electric bulb needs to be frequently replaced due to its short lifespan, it consumes many man hours and costs for maintenance.

It should be understood that the aforementioned techniques refer to the related art to which the invention pertains, and are not conventional techniques.

In order to solve such problems, a semi-permanent light emitting diode (LED) lamp is applied to signboards to reduce repair costs and replacement of lamps, thereby improving convenience and market quality.

When an LED lamp per se is used as an advertisement board, a color tape is attached to an LED chip to exhibit a color, or a color ink is applied to a mask, which in turn is removed to exhibit a color.

In the advertisement board using the LED chip, since the LED chip is soldered to a hard printed circuit board, a long time is consumed for soldering. Further, a number of processes, such as deposition and etching, are performed to form a circuit pattern on the printed circuit board, and post-processes, such as masking and ink printing, for exhibiting a color, must be performed, thereby complicating the process and increasing manufacturing costs.

BRIEF SUMMARY

The present invention is conceived to solve such problems, and an aspect of the present invention is to provide a method of manufacturing a color printed circuit board, which includes printing an electrically conductive pattern on a flexible board with a conductive ink and printing a color pattern on a light emitting chip mounted on the board using a color ink to exhibit a color, thereby enabling reduction in time and cost for manufacturing the color printed circuit board.

In accordance with an aspect of the invention, a method of manufacturing a color printed circuit board includes: non-consecutively printing a conductive ink on a flexible insulation board in a piezoelectric inkjet manner to form an electrically conductive pattern; applying an electrically conductive bonding agent to a light emitting chip mounting portion of the electrically conductive pattern for mounting a light emitting chip; forming a waterproof layer on an overall surface of a resultant after mounting the light emitting chip on the light emitting chip mounting portion of the electrically conductive pattern to which the electrically conductive bonding agent is applied; and forming a color pattern on an overall surface of the light emitting chip using a color ink.

The method may further include forming a spacer to secure the light emitting chip mounted on the light emitting chip mounting portion.

The method may further include forming a color developing layer on the overall surface of the resultant so as to expose the light emitting chip after mounting the light emitting chip.

The light emitting chip may be a light emitting diode (LED) chip.

The insulation board may be made of a polymer material.

BRIEF DESCRIPTION OF THE DRAWINGS

The above and other aspects, features and advantages of the invention will become apparent from the following detailed description in conjunction with the accompanying drawings, in which.

DETAILED DESCRIPTION

Embodiments of the invention will now be described in detail with reference to the accompanying drawings. It should be noted that the drawings are not to precise scale and may be exaggerated in thickness of lines or sizes of components for descriptive convenience and clarity only. Furthermore, the terms as used herein are defined by taking functions of the invention into account and can be changed according to the custom or intention of users or operators. Therefore, definition of the terms should be made according to the overall disclosure set forth herein.

Figure 6:
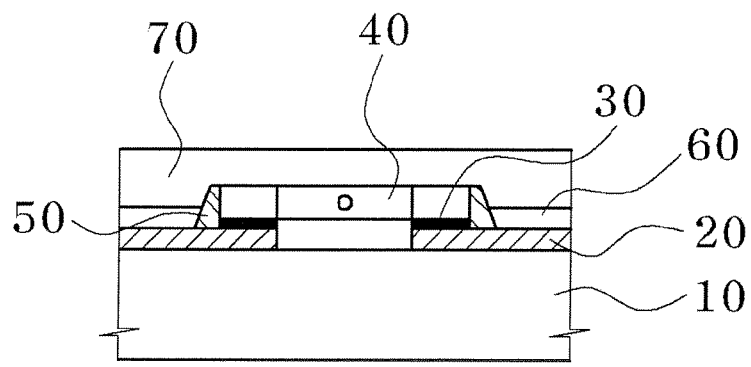
Figure 7:
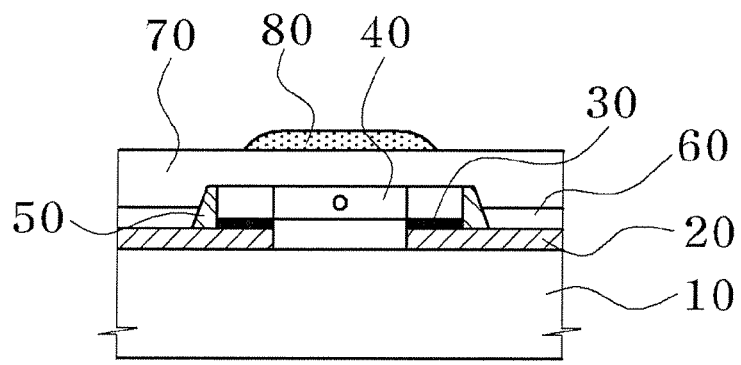
Figure 8:
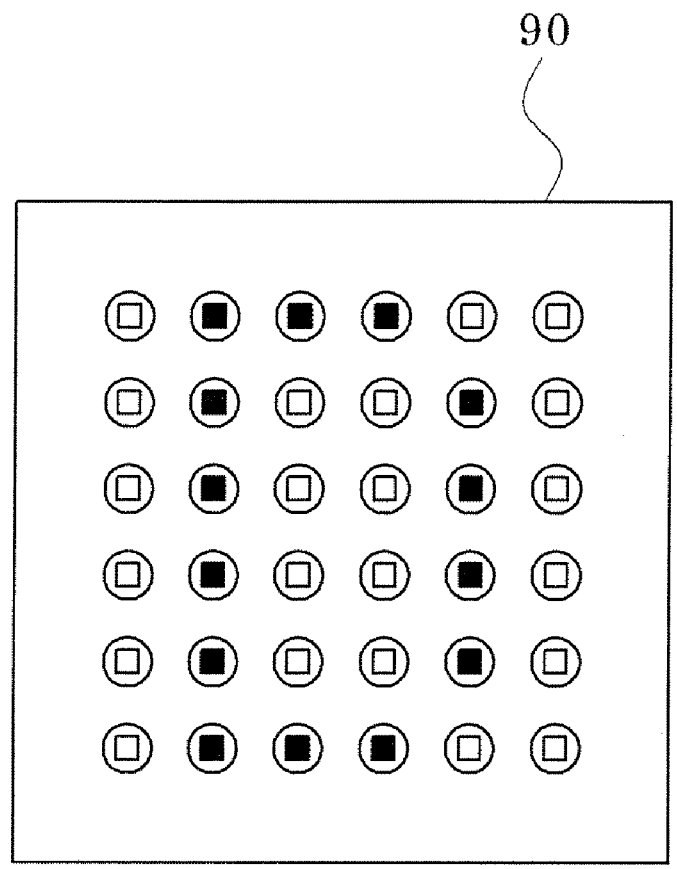
FIG. 8 is a plan view of a color printed circuit board in accordance with an embodiment of the present invention.

FIGS. 1 to 7 are sectional views sequentially illustrating a method of manufacturing a color printed circuit board in accordance with an embodiment, and FIG. 8 is a plan view of a color printed circuit board in accordance with an embodiment.

Figure 1:
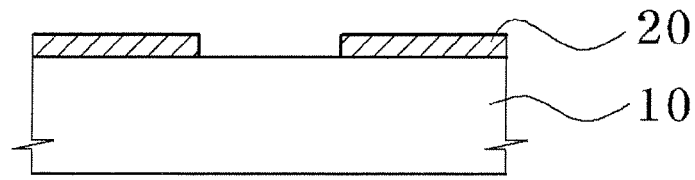
FIGS. 1 to 7 are sectional views sequentially illustrating a method of manufacturing a color printed circuit board in accordance with an embodiment of the present invention.

First, referring to FIG. 1, a conductive ink is non-consecutively printed on a flexible insulation board 10 in a piezoelectric inkjet manner to form an electrically conductive pattern 20.

Here, since the conductive ink is printed to form the electrically conductive pattern 20, the insulation board 10 may be made of a polymer material, which is a general printing medium. Not only does use of such general printing media, that is, the insulation board 10, improve productivity, but flexibility of the insulation board 10 also allows the insulation board 10 to be wound for maintenance and protects the insulation board 10 from external impact, thereby providing good durability.

In other words, the insulation board 10 has insulation properties and has a planar shape, such as a film shape, sheet shape, plate shape, and the like. Additionally, the insulation board 10 may have a curved shape as long as it permits inkjet printing thereon.

Particularly, the conductive ink may be automatically sprayed to the insulation board 10 through a piezoelectric inkjet head (not shown).

The conductive ink contains metallic particles uniformly dissociated in an organic solvent. The metallic particles may have a nano-size to form a fine pattern. Any known method may be used to form a wire using such a conductive ink.

Examples of the metallic particles may include, but are not limited to, gold (Au), silver (Ag), copper (Cu), platinum (Pt), nickel (Ni), aluminum (Al), titanium (Ti), palladium (Pd), tin (Sn), vanadium (V), zinc (Zn), manganese (Mn), cobalt (Co), zirconium (Zr), iron (Fe), and the like.

These metals may be used alone or in a combination of two or more thereof. Particularly, Au, Ag, and Ni may be used due to their good conductivity. Further, an alloy of two or more selected from these metals may be used. In view of manufacturing costs, silver may be advantageously used.

The metallic particles may have a size of 1 to 100 nm, and preferably a size of 5 to 50 nm to form a fine wire of several dozen micrometers or less.

Further, in order to allow the metallic particles to be uniformly and stably dissociated in the solvent, a capping molecule is required to enclose the metallic particle. Any capping molecule may be used without limitation. For example, the capping molecule may be a compound comprising a chemical group having electrons in a lone electric pair of nitrogen, oxygen or sulfur capable of forming a coordinate covalent bond with the metallic particle. Specifically, the capping molecule may be a compound having an amino group ($—NH_2$) including a nitrogen element, a sulfonyl group (—SH) including a sulfur element, a thiol group (—S—), a hydroxyl group (—OH) including an oxygen element, an oxy group (—O—) of an ether shape, and the like.

In the conductive ink, the solvent may be, but is not limited to, an aqueous solvent or a non-aqueous solvent depending on the properties of the metallic particles.

For example, the non-aqueous solvent may include toluene, tetradecane, or a mixture thereof, and the aqueous solvent may include water, an aqueous solution of diethylene glycol butyl ether acetate and ethanol, and a mixture thereof.

The conductive ink may be prepared by placing and dispersing the metallic particles in the solvent with a sonicator. Although it can be affected by a nozzle condition, printing condition, particle size, and the like, a desired viscosity of the conductive ink suitable for printing a fine pattern is 1~50 cps, and preferably in the range of 5~20 cps.

When preparing the conductive ink, a conductive material is dispersed in the aqueous or non-aqueous solvent, and additives such as a dispersant and the like are mixed therewith. The conductive ink of metallic nano particles may form fine wires with high line width accuracy, and may be conveniently converted into an electrically conductive pattern by burning a coating layer of the metallic nano particles.

Additionally, for piezoelectric inkjet printing, a suitable spraying method may be adopted by taking a printing pattern or the kind of ink into consideration. The spraying method includes a piezoelectric element type, a bubble jet type, an electrostatic induction type, a continuous spraying type, and the like.

Figure 2:
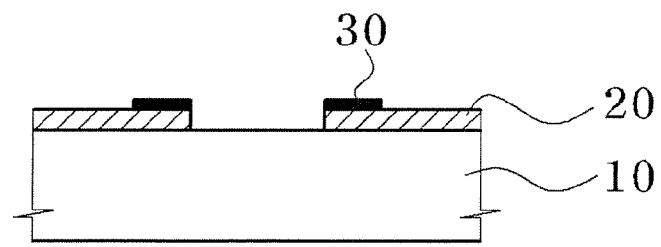

Next, as shown in FIG. 2, an electrically conductive bonding agent 30 is applied to a light emitting chip mounting portion of the electrically conductive pattern 20 on which a light emitting chip 40 will be mounted.

The electrically conductive bonding agent 30 allows an LED provided as the light emitting chip 40 to be in contact with the electrically conductive pattern 20 instead of a solder. The electrically conductive bonding agent 30 is made of transparent silicone and contains metallic powder having conductivity, such as silver or gold, in a mobile liquid. As a result, not only does the electrically conductive bonding agent 30 secure the light emitting chip 40 to the electrically conductive pattern 20, but it also allows an anode and a cathode of the light emitting chip 40 to be connected to the electrically conductive pattern 20 so as to electrically operate.

Particularly, with the electrically conductive pattern 20 completely dried, the electrically conductive bonding agent 30 is applied to the light emitting chip mounting portion of the electrically conductive pattern 20 and dried by heat, thereby allowing the light emitting chip 40 to be in secure contact with the electrically conductive pattern 20.

Figure 3:
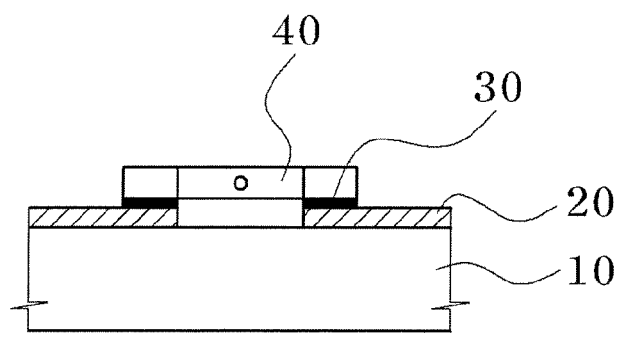

Then, as shown in FIG. 3, the light emitting chip 40 is mounted on the electrically conductive pattern 20, to which the electrically conductive bonding agent 30 is applied, and is then securely bonded to the electrically conductive pattern 20 by thermal drying or the like.

Figure 4:
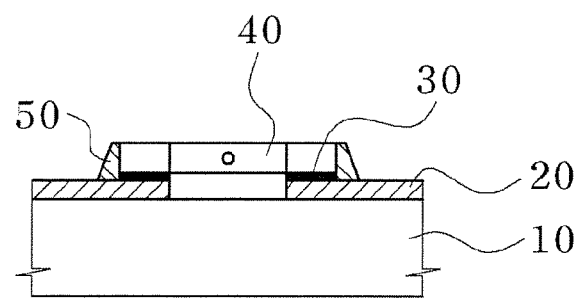

Next, as shown in FIG. 4, a spacer 50 is formed around the light emitting chip 40 by depositing a waterproof bonding agent on an overall surface of the light emitting chip 40 to prevent the light emitting chip 40 from being moved or separated by a subsequent process or external impact, so that the light emitting chip 40 can be more firmly secured to the electrically conductive pattern 20.

Figure 5:
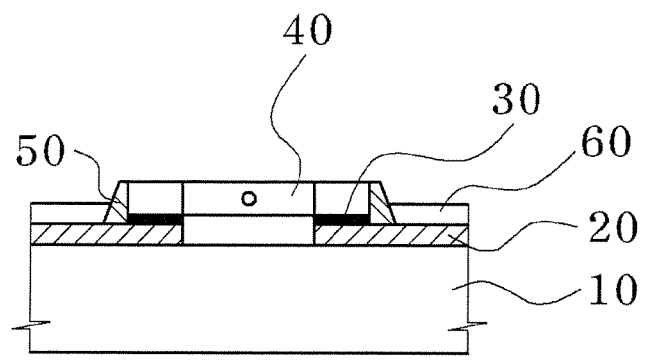

Next, as shown in FIG. 5, a color developing layer 60 is formed by applying a white color developing ink to an overall surface of a resultant, on which the light emitting chip 40 is mounted.

Not only does the color developing layer 60 reflect light emitted from the light emitting chip to allow clear recognition, but it also prevents deterioration of the electrically conductive pattern 20 under the color developing layer 60.

Then, as shown in FIG. 6, a waterproof layer 70 is formed on the overall surface of the resultant to protect the light emitting chip 40 and the electrically conductive pattern 20 from water and foreign matter from the outside while maintaining electrical insulation.

The waterproof layer 70 may be formed by coating a film paper or by depositing and drying a transparent silicone resin.

Then, a pattern of various colors 80 is formed by printing color inks on the overall surface of the light emitting chip 40, as shown in FIG. 7.

Referring to FIG. 8, a pattern of "D" is formed on a color printed circuit board 90 by printing the color pattern 80 with the color inks in this manner.

As such, the electrically conductive pattern 20 is formed by printing a variety of patterns on the flexible board 10 with conductive inks in a piezoelectric inkjet manner and the light emitting chip 40 is then mounted on the electrically conductive pattern 20 to form a printed circuit board. Further, the color printed circuit board 90 is formed by forming the color pattern 80 on the light emitting chip 40 using the color inks, thereby improving productivity by reducing dependence on manual labor. The color printed circuit board 90 may be used as an advertisement board, thereby reducing time for manufacturing the advertisement board.

As such, in the manufacturing method according to the embodiment, an electrically conductive pattern is printed on a flexible board with a conductive ink and a color pattern is printed with color inks on a light emitting chip mounted on the board to exhibit a color, thereby improving productivity through a reduction in the number of processes in manufacturing a color printed circuit board while reducing cost for manufacturing an advertisement board by using the color printed circuit board as the advertisement board.

Although some embodiments have been provided to illustrate the invention in conjunction with the drawings, it will be apparent to those skilled in the art that the embodiments are given by way of illustration only, and that various modifications, changes, alterations, and equivalent embodiments can be made without departing from the spirit and scope of the invention. The scope of the invention should be limited only by the accompanying claims.

What is claimed is:

1. A method of manufacturing a color printed circuit board, comprising:

non-consecutively printing a conductive ink on a flexible insulation board in a piezoelectric inkjet manner to form an electrically conductive pattern;

applying an electrically conductive bonding agent to a light emitting chip mounting portion of the electrically conductive pattern for mounting a light emitting chip;

forming a waterproof layer on an overall surface of a resultant after mounting the light emitting chip on the light emitting chip mounting portion of the electrically conductive pattern to which the electrically conductive bonding agent is applied; and forming a color pattern on an overall surface of the light emitting chip using a color ink.

2. The method according to claim 1, further comprising:

forming a spacer to secure the light emitting chip mounted on the light emitting chip mounting portion.

3. The method according to claim 1, further comprising:

forming a color developing layer on the overall surface of the resultant so as to expose the light emitting chip after mounting the light emitting chip.

4. The method according to claim 1, wherein the light emitting chip is a light emitting diode (LED) chip.

5. The method according to claim 1, wherein the insulation board is made of a polymer material.

\* \* \* \* \*